(12) United States Patent
Shinohara

(10) Patent No.: US 7,642,640 B2
(45) Date of Patent: Jan. 5, 2010

(54) SEMICONDUCTOR DEVICE AND MANUFACTURING PROCESS THEREOF

(75) Inventor: Toshiaki Shinohara, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 211 days.

(21) Appl. No.: 11/258,213

(22) Filed: Oct. 26, 2005

(65) Prior Publication Data

US 2006/0091512 A1    May 4, 2006

(30) Foreign Application Priority Data

Nov. 1, 2004    (JP) ............................. 2004-317929

(51) Int. Cl.
*H01L 23/04* (2006.01)

(52) U.S. Cl. ................................................. 257/699

(58) Field of Classification Search ................. 257/706, 257/707, 691, 723, 724, 699; 438/107, 110, 438/121, 122
See application file for complete search history.

(56) References Cited

U.S. PATENT DOCUMENTS

| | | | |
|---|---|---|---|
| 3,364,400 A * | 1/1968 | Granberry | 257/699 |
| 3,820,153 A * | 6/1974 | Quinn | 257/724 |
| 4,012,768 A * | 3/1977 | Kirk et al. | 257/712 |
| 4,639,760 A * | 1/1987 | Granberg et al. | 257/705 |
| 5,315,155 A * | 5/1994 | O'Donnelly et al. | 257/711 |
| 5,471,089 A * | 11/1995 | Nagatomo et al. | 257/691 |
| 5,710,695 A * | 1/1998 | Manteghi | 361/813 |
| 6,028,358 A * | 2/2000 | Suzuki | 257/737 |
| 6,057,593 A * | 5/2000 | Iovdalsky et al. | 257/659 |
| 6,509,629 B2 * | 1/2003 | Yoshimatsu et al. | 257/660 |
| 6,693,350 B2 | 2/2004 | Teshima et al. | |
| 6,703,707 B1 | 3/2004 | Mamitsu et al. | |
| 6,943,443 B2 | 9/2005 | Nobori et al. | |
| 7,149,088 B2 * | 12/2006 | Lin et al. | 361/704 |
| 7,221,042 B2 * | 5/2007 | Bambridge | 257/666 |
| 2004/0089928 A1 | 5/2004 | Nakajima et al. | |
| 2004/0089941 A1 | 5/2004 | Mamitsu et al. | |
| 2007/0235860 A1 * | 10/2007 | Steger et al. | 257/706 |

FOREIGN PATENT DOCUMENTS

CN    1471730 A    1/2004

(Continued)

OTHER PUBLICATIONS

Official Action issued by the Patent Office of the People's Republic of China in corres. Chinese Patent Application No. 200510118643.7, Jul. 20, 2007; and English translation thereof.

(Continued)

*Primary Examiner*—S. V Clark
(74) *Attorney, Agent, or Firm*—Buchanan Ingersoll & Rooney PC

(57) ABSTRACT

The semiconductor device according to one of the embodiments of the present invention includes a metal block having first and second main surfaces and defining a recess on the first main surface. It also includes a semiconductor chip received within the recess of the metal block and mounted on the metal block. Further, a first terminal electrically connected with the semiconductor chip is provided, and a second terminal electrically connected with the metal block is also provided.

21 Claims, 8 Drawing Sheets

FOREIGN PATENT DOCUMENTS

| | | |
|---|---|---|
| DE | 43 00 516 A1 | 7/1994 |
| JP | 10-98140 | 4/1998 |
| JP | 11-126858 | 5/1999 |
| JP | 2002-329804 | 11/2002 |
| JP | 2003-46036 | 2/2003 |

OTHER PUBLICATIONS

Office Action from corresponding German application No. 10 2005 050 330.6, mailed on Nov. 26, 2008.

* cited by examiner

SEMICONDUCTOR DEVICE AND MANUFACTURING PROCESS THEREOF

BACKGROUND OF THE INVENTION

1) Technical Field of the Invention

The present invention relates to a semiconductor device and a manufacturing process thereof, and in particular to a transfer-mold type power semiconductor device and a manufacturing process thereof.

2) Description of Related Arts

A conventional transfer-mold type power semiconductor device, in general, includes a metal block having a mounting surface on which a power semiconductor chip such as an insulated gate bipolar transistor (IGBT) chip and a free wheel diode (FWD) chip is mounted via a solder layer. The power semiconductor chip includes a lower electrode (such as a collector electrode and a cathode electrode), an upper electrode (such as an emitter electrode, an anode electrode and a control (gate) electrode, if any). Also, the power semiconductor device includes a plurality of lead frames (terminals), at least one of which is electrically connected with the upper electrode of the Dower semiconductor chip via a thin wire of metal such as aluminum. Those components of the power semiconductor device are molded with resin covering the mounting surface of the metal block.

The power semiconductor device may include an insulating layer adhered on another surface opposite to the mounting surface of the metal block, and a metal thin layer formed on the insulating layer. In this case, the molded resin encompasses the metal block exposing the metal thin layer. The power semiconductor device is assembled with a heat sink (radiating fins, radiator) contacting with the metal thin layer. Another power semiconductor device may be mounted directly on the heat sink without the insulating layer. According to those conventional power semiconductor devices, heat generated in the power semiconductor chip is transmitted into the metal block and dissipated via the insulating layer or directly to the heat sink.

In the meantime, the heat dissipation feature from the power semiconductor device to the heat sink generally depends on the contacting area and the temperature difference between the metal block and the heat sink. Thus, in order to improve the heat dissipation feature, those skilled in the art may contemplate extension of the temperature difference and/or increase of the contacting area between the power semiconductor device and the heat sink.

However, if atmosphere temperature (e.g., ambient temperature of the heat sink) is constant, the temperature of the semiconductor chip has to be raised for extension of the temperature difference, thereby reducing the reliability of the semiconductor chip. Alternatively, increase of the contacting area prevents the power semiconductor device to be downsized. Also, even when the contacting area is extended, since the temperature inside the metal block decreases as being away from the power semiconductor chip, the heat dissipation feature cannot be improved as expected.

SUMMARY OF THE INVENTION

To address the aforementioned drawbacks, one of the aspects of the present invention is to provide a transfer-mold type power semiconductor device that has an improved heat dissipation feature without increasing the size of the power semiconductor device.

In particular, according to one of the embodiments of the present invention, the semiconductor device includes a metal block having first and second main surfaces and defining a recess on the first main surface. It also includes a semiconductor chip received within the recess of the metal block and mounted on the metal block. Further, a first terminal electrically connected with the semiconductor chip is provided, and a second terminal electrically connected with the metal block is also provided.

Further scope of applicability of the present invention will become apparent from the detailed description given herein. However it should be understood that the detailed description and specific examples, while indicating preferred embodiments of the invention, are given by way of illustration only, since various changes and modifications within the sprit and scope of the invention will become apparent to those skilled in the art from this detailed description.

BRIEF DESCRIPTION OF THE DRAWINGS

The present invention will be more fully understood from the detailed description given herein and accompanying drawings which are given by way of illustration only, and thus are not limitative of the present invention.

It should be noted that for clear illustration, some components of the power semiconductor device are eliminated in FIGS. 1C, 3, 4C, 5B, 7C, 9 and 10A.

DETAILED DESCRIPTION OF THE PREFERRED EMBODIMENTS

Referring to the attached drawings, the details of embodiments according to the present invention will be described herein. In those descriptions, although terminology indicating the directions (for example, "upper" and "lower") is conveniently used just for clarity, it should not be interpreted that such terminology limits the scope of the present invention.

Embodiment 1

Figure 1A:
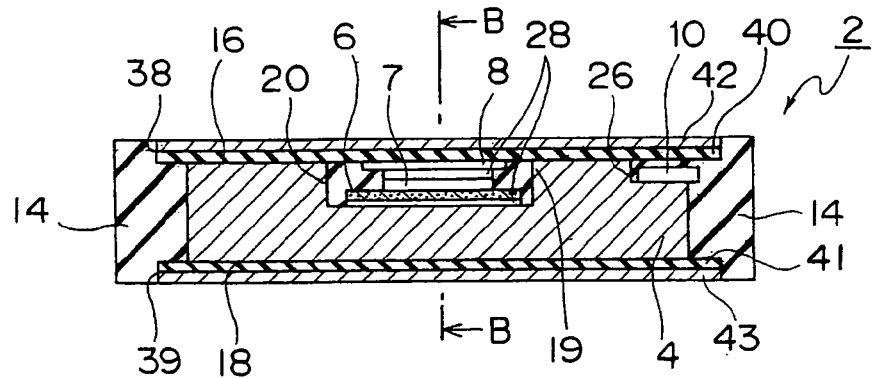
FIGS. 1A and 1B are cross sectional views taken along lines A-A and B-B in FIG. 1C, respectively.
Figure 1B:
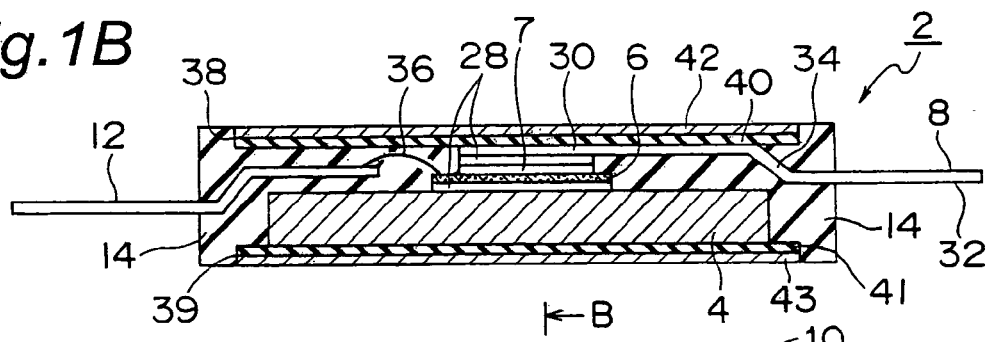
Figure 1C:
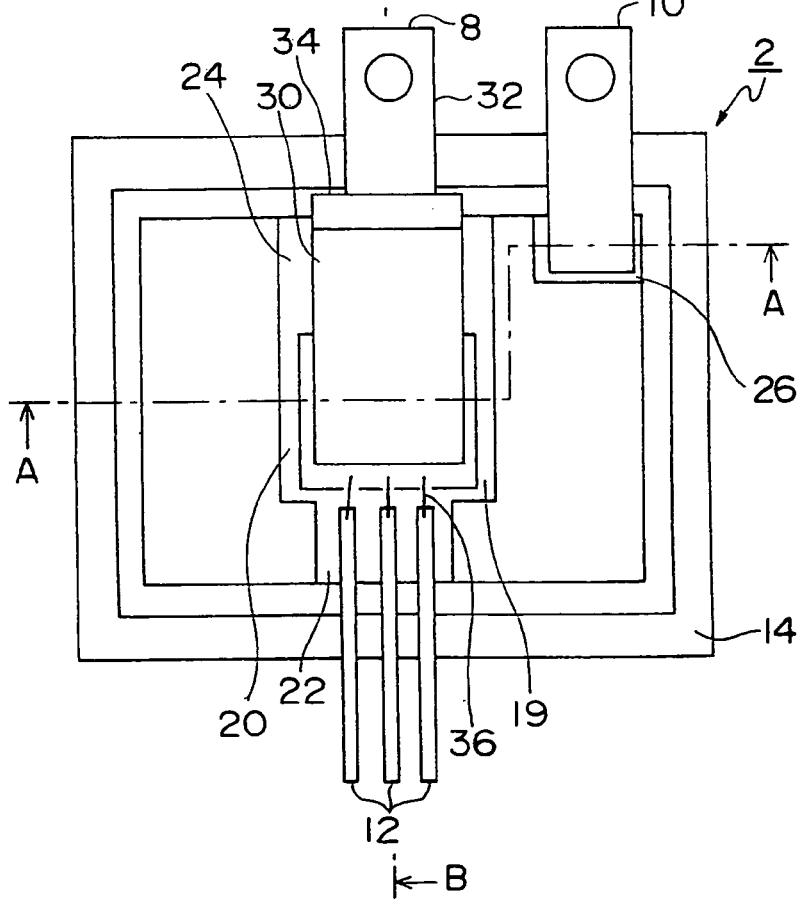
FIG. 1C is a top plan view of the power semiconductor device according to the first embodiment of the present invention.

With reference to FIGS. 1A-1C, a power semiconductor device 2 according to the first embodiment of the present invention will be described herein. As illustrated, the power semiconductor device 2, in general, includes a metal block 4, a power semiconductor chip 6, first and second lead frames (first and second terminals) 8, 10, a plurality of control lead frames (third terminals) 12, and a molded resin (packaging member) 14.

The metal block 4 is formed in a rectangular shape of a plate or mass of conductive material such as copper and aluminum, and includes first and second main surfaces 16, 18, that face upwardly and downwardly, respectively. The first and second main surfaces may be referred herein to as "upper and lower main surfaces 16, 18", respectively.

The metal block 4 of the present embodiment includes a channel 19 extending along a line B-B across the upper main surface 16 (FIG. 1C) and having a rectangular cross section taken along a line A-A (FIG. 1A). The channel 19 has a couple of recess regions for receiving different components of the power semiconductor device. In particular, the power semiconductor chip 6 is mounted on a first recess 20 in the channel 19 of the metal block 4. Provided within a second recess 22 are the control lead frames 12, and also arranged within a third recess 24 is the first lead frame 8. Thus, the first recess 20 is located between the second and third recesses 22, 24.

Also, as best illustrated in FIG. 1C, the metal block 4 includes another fourth recess (cutout portion) 26 at a corner on the upper main surface 16 of the metal block 4, which has a predetermined depth, for receiving and connecting with a second lead frame 10.

As shown in FIG. 1B, the channel 19 is designed so as to have a constant depth so that the bottom surfaces in the first, second and third recess 20, 22, 24 are at the same level. Instead, the depth of those recesses may be different from one another. Also, in FIG. 1C, although the second recess 22 has a width narrower than those of the first and third recesses 20, 24, the width of those recesses 20, 22, 24 may arbitrarily be selected in accordance with the size of the components received therein. In addition, the width and the depth of the fourth recess 26 may be determined based upon the size of the second lead frame 10.

The power semiconductor chip 6 includes an upper electrode 7 and a lower electrode (not shown), and is bonded within the first recess 20 on the metal block 4 via a solder layer 28. It should be noted that any type of conductive adhesives may be used rather than the solder layer in the embodiments described in the present application.

As illustrated in FIG. 1B, the first lead frame 8 is formed by bending a metal plate so as to include a first flat portion 30 at one end, and a second flat portion 32 at the other end, extending in parallel to each other. Also, the first lead frame 8 includes a connecting portion 34 between the first and second flat portions 30, 32. The first flat portion 30 of the first lead frame 8 extends along the channel 19 and is located within the first and third recess 20, 24, thereby to contact with upper electrode 7 of the power semiconductor chip 6 via the solder layer 28. In this situation, the first flat portion 30 has a top surface flush with the upper main surface 16 of the metal block 4. In other words, the first recess 20 of the channel 19 is designed so as to locate the top surface of the first flat portion 30 and the upper main surface 16 of the metal block 4 at the same level.

Each of the control lead frames 12 is made of conductive plate, which is thinner than the first lead frame 8. Also, the control lead frames 12 extend along the channel 19 and are located within the second recess 22. Each of the control lead frames 12 is connected with a control electrode (not shown) of the power semiconductor chip 6 via a conductive wire 36 of a material such as aluminum. As illustrated in FIG. 1B, the control lead frames 12 are embedded in and supported by the molded resin (packaging member) 14 when the metal block 4 is molded with resin.

The second lead frame 10 is also made of a thin conductive plate. It includes one end connected with the metal block 4 within the fourth recess 26 and the other end extending from the molded resin 14. As shown in FIG. 1A, the top surface of the second lead frame 10 is positioned below the upper main surface 16 of the metal block 4, thus, the depth of the fourth recess 26 is greater than the thickness of the second lead frame 10. Therefore, when the metal block 4 is molded with resin, the molded resin covers the top surface of the second lead frame 10. Also, electrical connection between the second lead frame 10 and the metal block 4 within the fourth recess 26 may be made through the solder layer or conductive adhesive, alternatively by means of an ultra-sonic connecting technique.

In addition, the power semiconductor device 2 includes first and second insulating members 38, 39 secured on the upper and lower main surfaces 16, 18, respectively. In particular, the first insulating member 38 covers across the upper main surface 16 and extends beyond the circumference of the upper main surface 16. Also, the first insulating member 38 is located along and over the channel 19 (first, second, third, and fourth recesses 20, 22, 24 and 26). As described above, since the first lead frame 8 is designed to have the top surface flush with the upper main surface 16, the first insulating member 38 contacts with the top surface of the first lead frame 8. Also, the second insulating member 39 covers across the lower main surface 18 and extends beyond the circumference of the lower main surface 18 of the metal block 4.

The insulating members 38, 39 each include resin layers 40, 41 of epoxy resin for electrical insulation and metal layers 42, 43 of conductive material, respectively. Also, the insulating members 38, 39 are secured on the upper and lower surfaces 16, 18 so that the resin layers 40, 41 oppose inwardly to the upper and lower surfaces 16, 18, respectively. The resin layers 40, 41 may contain an appropriate amount of one or more kinds of ceramic particles of material selected from a group consisting of alumina, aluminum nitride, silicon nitride, and boron nitride so that the insulating members 38, 39 have thermal conductivity greater than that of the molded resin 14. The metal layers 42, 43 are made of metal such as copper and aluminum.

The molded resin 14 is made of insulating resin material and encompasses the metal block 4 and inside ends of the first, second and control lead frames 8, 10, 12, while exposing the metal layers 42, 43 of the insulating members 38, 39 and outside ends of the first, second and control lead frames 8, 10, 12, as shown in FIG. 1B. Thus, the first, second and control lead frames 8, 10, 12 have outside ends extending from the molded resin 14, which are supported by upper and lower molding dice (not shown) during the molding step for manufacturing the power semiconductor device 2.

Figure 2:
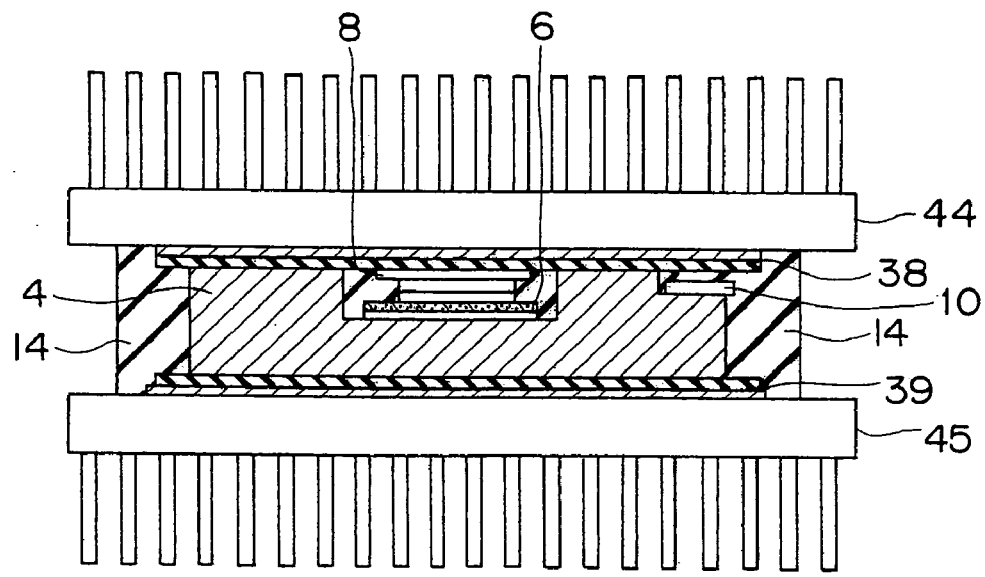
FIG. 2 is a cross sectional view of the power semiconductor device of the first embodiment, illustrating radiating fins secured on both surfaces thereof.

The power semiconductor device 2 so structured is installed between upper and lower heat sinks (radiators, radiating fins) 44, 45 as illustrated in FIG. 2. To this end, heat generated in the power semiconductor chip 6 is transmitted to the metal block 4, which in turn is dissipated through the upper and lower insulating members 38, 39 and the upper and lower heat sinks 44, 45 to the atmosphere. Also, the heat generated in the power semiconductor chip 6 is transmitted to the flat portion 30 of the first lead frame 8 which in turn is dissipated through the upper insulating member 38 and the upper heat sinks 44 to the atmosphere. As described above, the resin layer 40 of the upper insulating member 38 with high thermal conductivity transmits the heat as quickly and smoothly as the other components such as metal block 4, the first and second lead frames 8, 10 and the metal layer 42, thereby substantially improving the heat dissipation feature of the power semiconductor device 2.

As described above, according to the power semiconductor device 2 of the first embodiment, the heat generated in the power semiconductor chip 6 can efficiently be dissipated from the upper and lower radiating fins 44, 45 so that the reliability of the power semiconductor device 2 is substantially improved. In other words, the power semiconductor chip 6 that controls intense amount of current can be incorporated in the power semiconductor device 2. Further, because of the high heat dissipation feature, the metal block 4 and the power semiconductor device 2 can substantially be downsized.

Also, the power semiconductor device 2 is described above to have the first lead frame 8 and the upper chip electrode 7 to be connected to each other via the solder layer 28. However, the first lead frame 8 and upper chip electrode 7 may be electrically connected through a conductive wire.

Further, although FIG. 1 illustrates only one power semiconductor chip 6 on the metal block 4, the power semiconductor device of the present invention may include a plurality of power semiconductor chips 6 on the metal block 4. In this instance, the metal block 4 may have one or more channels or recesses on either one of the upper and lower main surfaces 16, 18. Alternatively, the channels (recesses) for receiving the power semiconductor chips may be formed both on the upper and lower main surfaces 16, 18 of the metal block 4.

Figure 3:
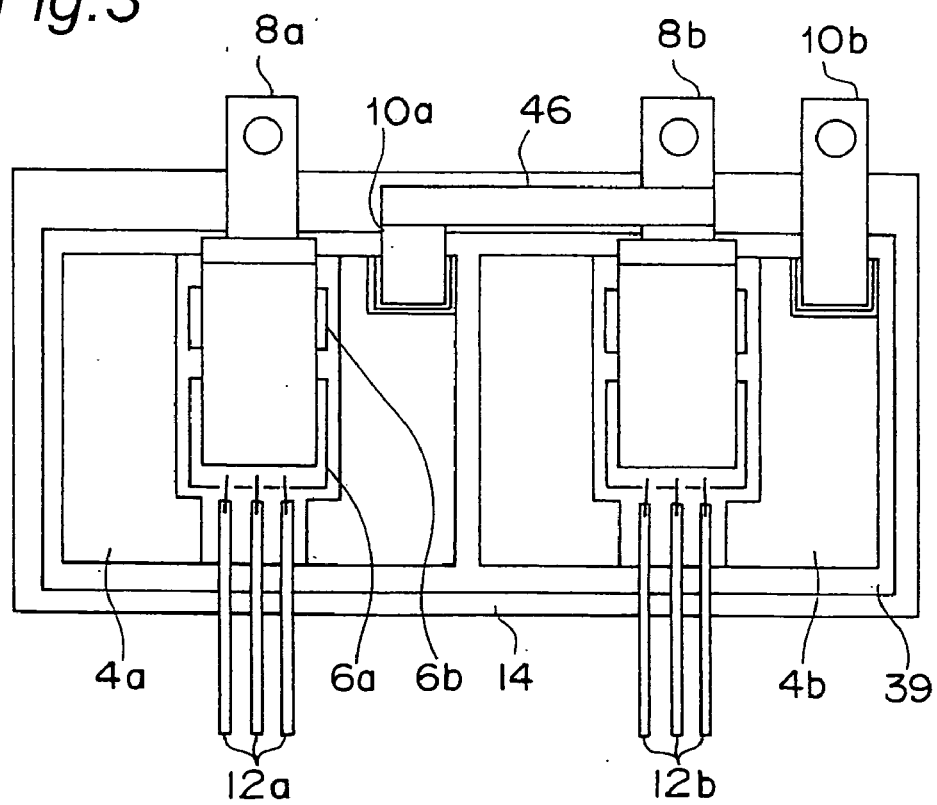
FIG. 3 is a top plan view of a modified power semiconductor device of the first embodiment.

In addition, as illustrated in FIG. 3, a plurality of metal blocks 4a, 4b may be provided between the upper and lower insulating members 38, 39, although illustration of the upper insulating member 38 is eliminated for clarity. Then, the metal blocks 4a, 4b and the upper and lower insulating members 38, 39 may be integrally molded with resin. The second lead frame 10a secured on one of the metal block 4a may be electrically connected to the first lead frame 8b for another metal block 4b via a connecting lead frame 46 within the molded resin. Also, as shown in FIG. 3, a plurality of semiconductor chips such as an insulated gate bipolar transistor (IGBT) chip 6a and a free wheel diode (FWD) chip 6b may be mounted on a single metal block 4a, 4b. In the particular case, the first lead frame 8a is electrically connected with the chip electrodes (not shown) such as an emitter electrode of the IGBT chip 6a and an anode electrode of the FWD chip 6b.

Embodiment 2

Figure 4A:
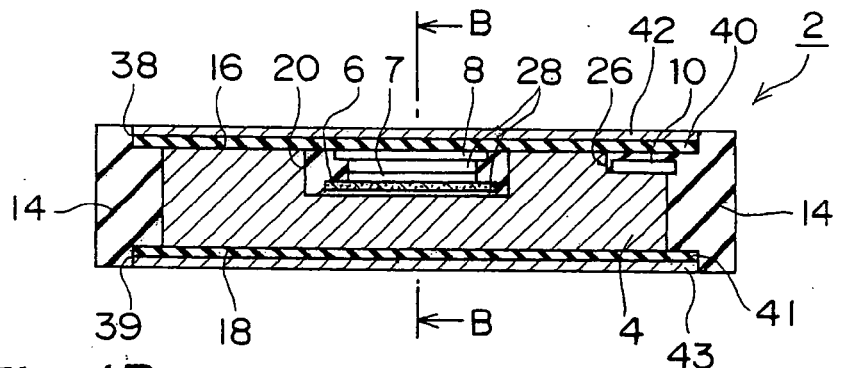
FIGS. 4A and 4B are cross sectional views taken along lines A-A and B-B in FIG. 4C, respectively.
Figure 4B:
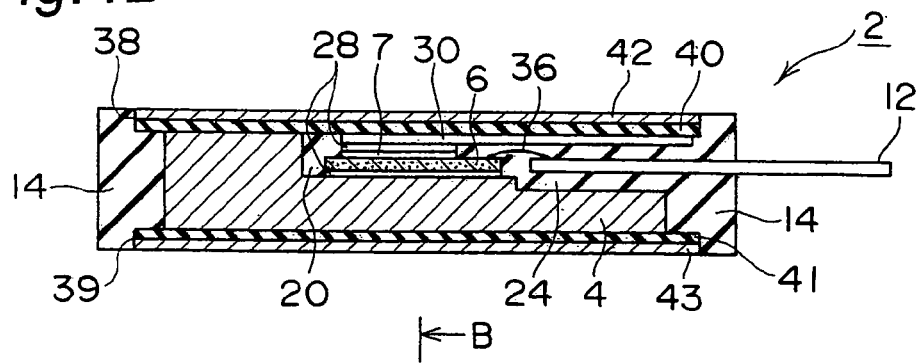
Figure 4C:
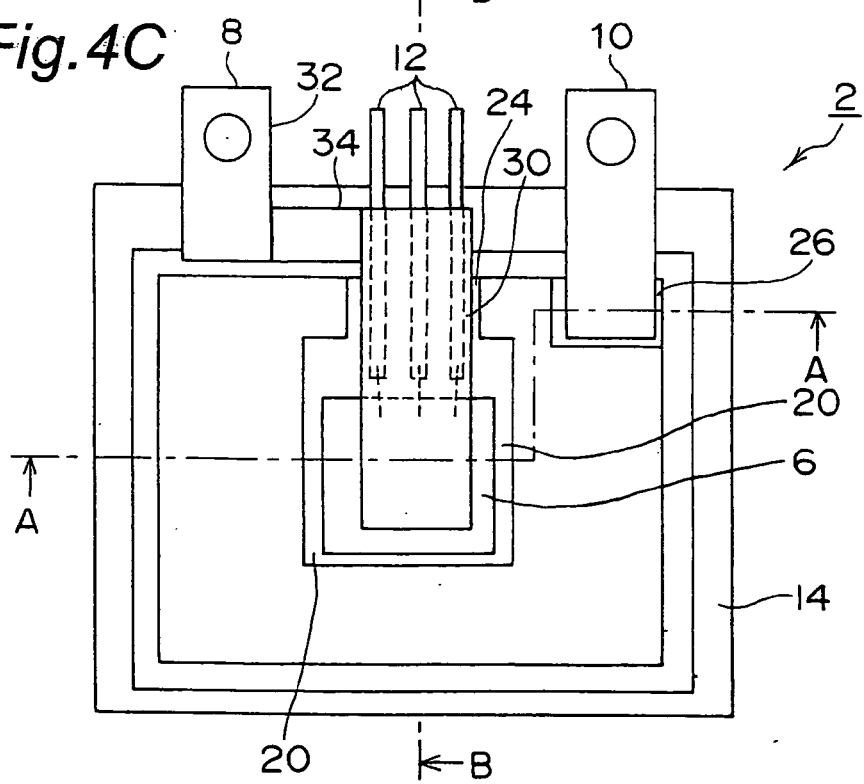
FIG. 4C is a top plan view of the power semiconductor device according to the second embodiment of the present invention.

Referring to FIGS. 4A-4C, another power semiconductor device according to the second embodiment of the present invention will be described herein. The power semiconductor device 2 of the second embodiment is similar to that of the first embodiment except that, in general, the metal block includes the first and third recesses only and defines no channel extending across the upper main surface. The components shown in FIGS. 4A-4C similar to those in FIGS. 1A-1C have the reference numerals similar thereto, and the duplicate description for the similar structure of the second embodiment will be eliminated.

As described above, while in the first embodiment, the first recess 20 along with the second and third recess 22, 24 defines the channel 19 extending across the upper main surface, according to the second embodiment, the second recess 22 is eliminated and the third recess 24 receives the first lead frame 8 and the third lead frames 12 as well. Also, as shown in FIG. 4B, the third recess 24 is designed to be deeper than the first recess 20.

The first lead frame 8 includes the first flat portion 30, and the second flat portion 32, extending in parallel to each other. It also includes the connecting portion (bending portion) 34 between the first and second flat portions 30, 32, extending perpendicular to those flat portions. Thus, the first lead frame 8 is bent at the interfaces between the first flat portion 30 and the connecting portion 34 and between the connecting portion 34 and the second flat portion 32 so that the second flat portions 32 has a level lower than the first flat portions 30.

Within the third recess 24, the control lead frame 12 and the conductive wire 36 are located between the first flat portion 30 of the first lead frame 8 and the metal block 4, as illustrated in FIG. 4B. According to the present embodiment, the first lead frame 8 is connected with the chip electrode 7 of the power semiconductor chip 6 via the solder layer 28, and the top surface of the first lead frame 8 contacts with the insulating member 38, as the first embodiment. However, the second flat portion 32 of the first lead frame 8 of this embodiment extends outwardly from a position different (offset) from one of the first embodiment (see FIG. 4C)

The control lead frames 12 are provided within the third recess 24 so that one ends thereof are electrically connected with the control electrode (not shown) such as a gate electrode of the IGBT chip, via the conductive wires 36.

Upon arrangement of the first lead frame 8 and the control lead frames 12 within the third recess 24 and elimination of the second recess, the contacting area between the upper main surface 16 of the metal block 4 and the upper insulating member 38 can substantially be extended by the area corresponding to the second recess. Therefore, the heat generated in the power semiconductor chip 6 can more efficiently be dissipated from the upper main surface 16 of the metal block 4 than the first embodiment.

Further, in the power semiconductor device 2 of the second embodiment, the first flat portion 30 of the first lead frame 8 may preferably have a through-hole (not shown) close to the wire-bonding portions on the chip electrode 7 and the control lead frames 12 for facilitating the wire-bonding therebetween. This makes it easy to use a device for supporting the lead frames and wire-bonding tools.

Embodiment 3

Figure 5A:
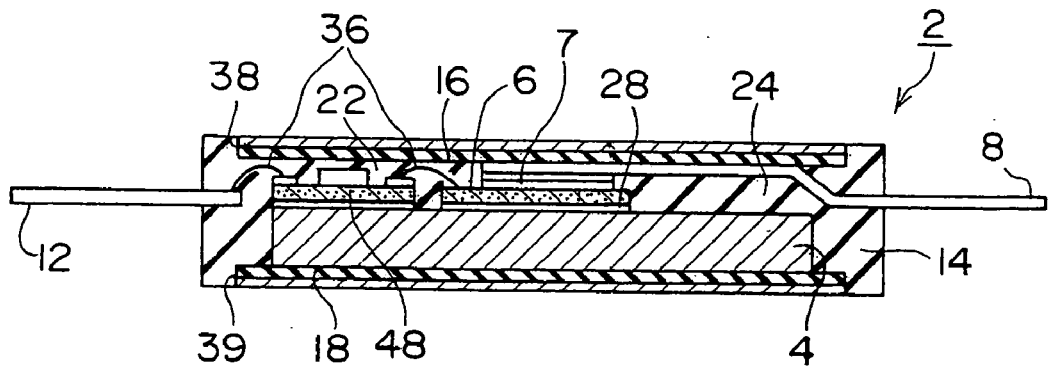
FIG. 5A is a cross sectional view taken along a line A-A in FIG. 5B.
Figure 5B:
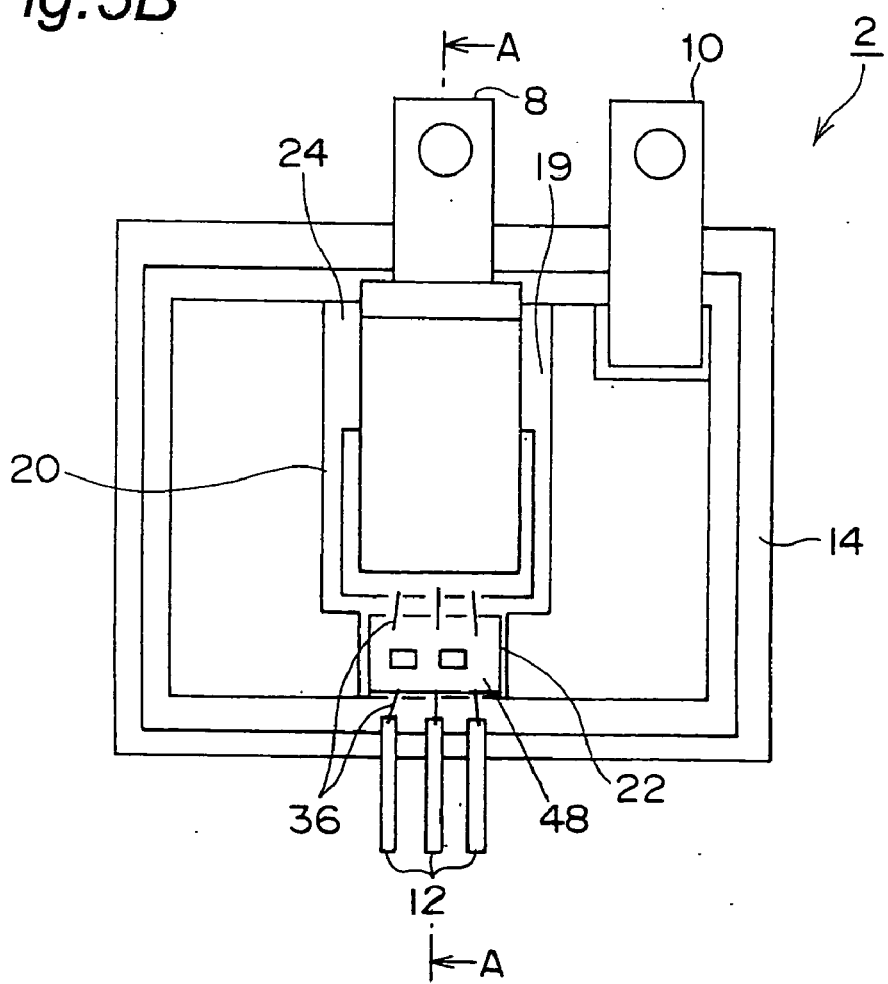
FIG. 5B is a top plan view of the power semiconductor device according to the third embodiment of the present invention.

Referring to FIGS. 5A-5B, another power semiconductor device according to the third embodiment of the present invention will be described herein. The power semiconductor device 2 of the third embodiment is similar to that of the first embodiment except that a control circuit board is provided on the second recess of the metal block. The components shown in FIGS. 5A-5B similar to those in FIGS. 1A-1C have the reference numerals similar thereto, and the duplicate description for the similar structure of the third embodiment will be eliminated.

The power semiconductor device 2 of the third embodiment includes a channel 19 (i.e., the first, second, and third recesses 20, 22, 24) extending across the upper main surface 16 of the metal block 4 as the first embodiment. Also, as described above, it includes a control circuit board 48 mounted on the bottom surface in the second recess 22 of the metal block 4 via any type of adhesive (not shown). Electrical connections of the control circuit board 48 with the control electrode of the power semiconductor chip 6 and the control lead frames 12 are made by the conductive wires 36. The conductive wires 36 may be formed of any metal including not only aluminum but also gold, for example.

The control circuit board 48 provides the power semiconductor device 2 with various control functions as so-called an intelligent power module.

Embodiment 4

Figure 6A:
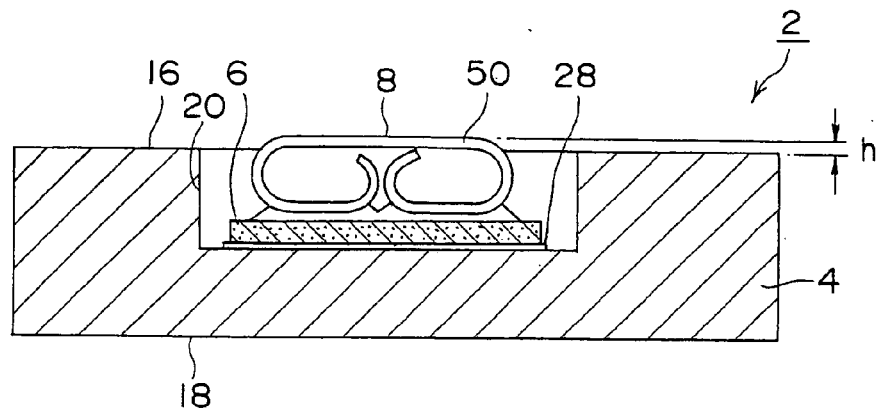
FIGS. 6A and 6B are cross sectional views similar to FIGS. 1A and 4A of the power semiconductor device according to the fourth embodiment of the present invention, illustrating it before and after being molded with resin, respectively.
Figure 6B:
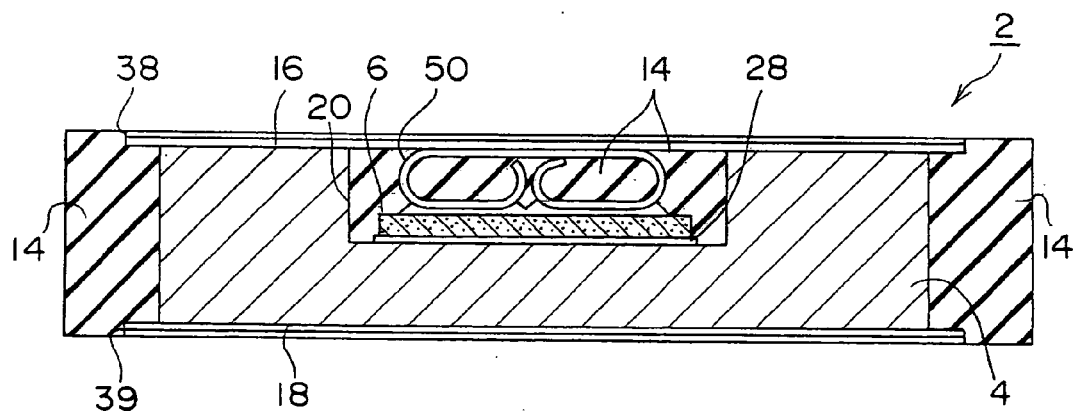

Referring to FIGS. 6A-6B, another power semiconductor device according to the fourth embodiment of the present invention will be described herein. The power semiconductor device 2 of the fourth embodiment is similar to that of the first embodiment except that instead of the flat portion of the first lead frame, a curled portion is provided at one end close to the chip electrode. The components shown in FIGS. 6A-6B similar to those in FIGS. 1A-1C have the reference numerals similar thereto, and the duplicate description for the similar structure of the fourth embodiment will be eliminated.

As illustrated in FIGS. 6A-6B similar to FIG. 1, in the power semiconductor device 2 of the fourth embodiment, the first lead frame 8 includes a pair of curled portions 50 formed closed to the power semiconductor chip 6 formed by curling a thin plate of metal. It may include a single curled portion 50. The first lead frame 8 has elasticity in the direction of the thickness because of the curled portion 50. One or more curled portions 50 are electrically connected with the chip electrode 7 of the power semiconductor chip 6 via a solder layer 28.

As shown in FIG. 6A, before being molded with resin, the first lead frame 8 is designed such that it raises the top surface thereof over the upper main surface 16 of the metal block 4 by a distance "h". During the resin molding step, the metal block 4 is sandwiched between the upper and lower insulating members 38, 39, and the curled portion 50 is pressed downwardly by the upper insulating member 38. Then, while the curled portion 50 deforms to bias the power semiconductor chip 6 with its elasticity, the molded resin is cured so that the first lead frame 8 has the top surface flush with the upper main surface 16 of the metal block 4, thereby to facilitate the stable heat dissipation both from the curled portion 50 of the first lead frame 8 and the metal block 4.

Embodiment 5

Figure 7A:
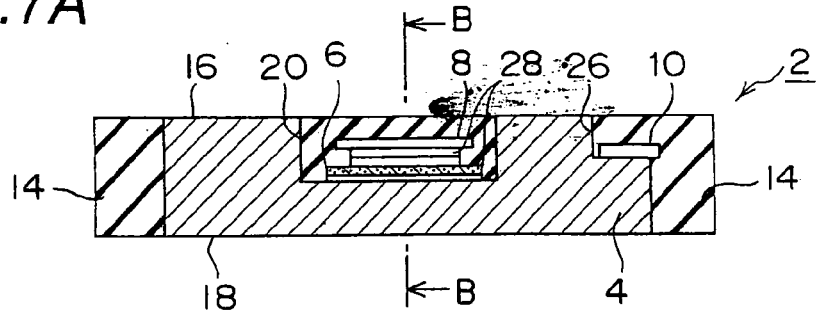
FIGS. 7A and 7B are cross sectional views taken along lines A-A and B-B in FIG. 7C, respectively.
Figure 7B:
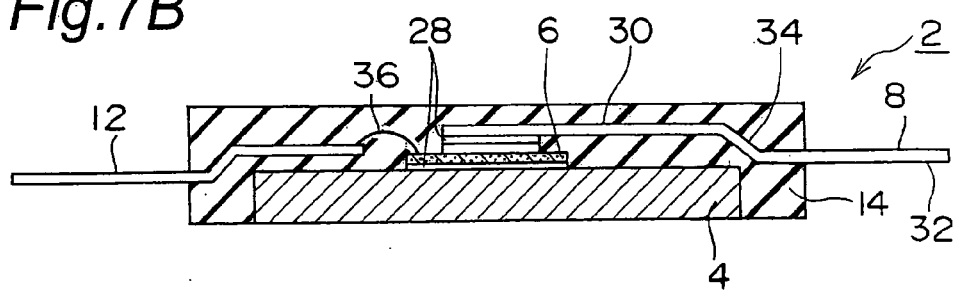
Figure 7C:
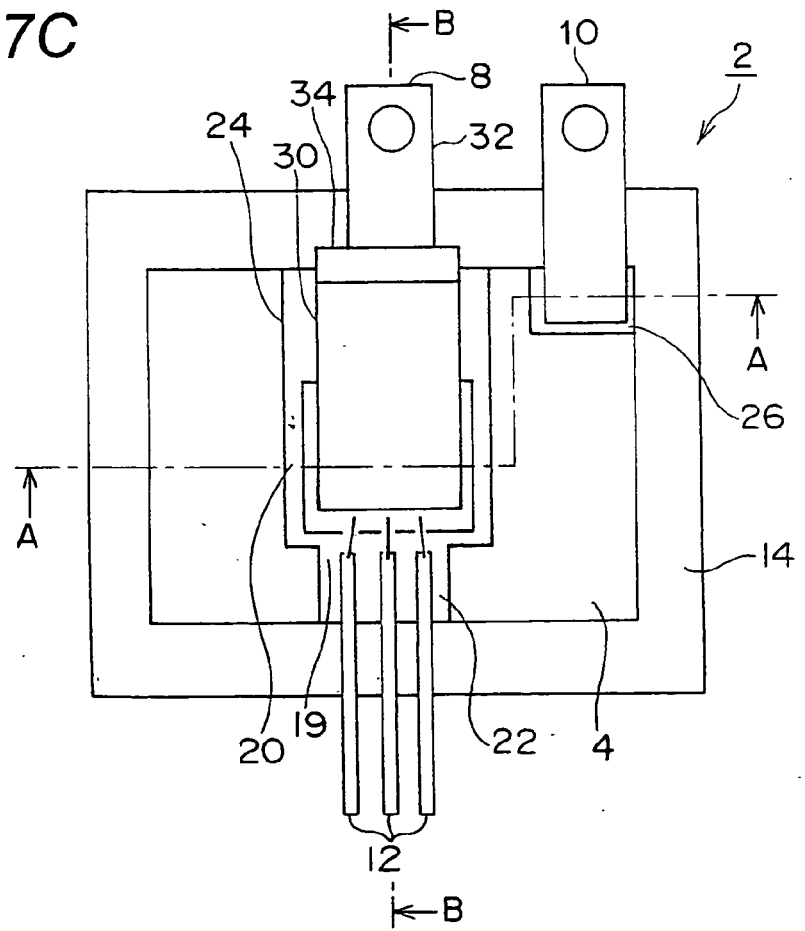
FIG. 7C is a top plan view of the power semiconductor device according to the fifth embodiment of the present invention.

Referring to FIGS. 7A-7C, another power semiconductor device according to the fifth embodiment of the present invention will be described herein. The power semiconductor device 2 of the fifth embodiment is similar to that of the first embodiment except that the first lead-frame has the top surface beneath the plane flush with the upper main surface of the metal block. The components shown in FIGS. 7A-7C similar to those in FIGS. 1A-1C have the reference numerals similar thereto, and the duplicate description for the similar structure of the fifth embodiment will be eliminated.

As described above, while in the first embodiment, the first lead frame 8 has the top surface flush with the upper main surface 16 of the metal block 4, according to the fifth embodiment, the first lead frame 8 has the top surface beneath the plane flush with the upper main surface 16. Therefore, when the metal block is molded with resin, the top surface of the first lead frame 8 is totally covered by the molded resin.

Figure 8:
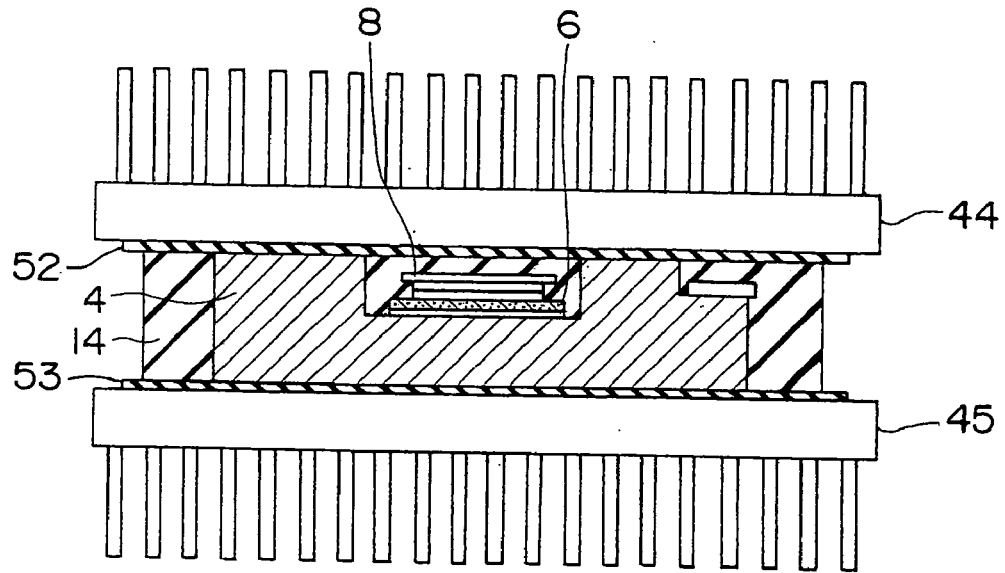
FIG. 8 is a cross sectional view similar to FIG. 7A of the power semiconductor device according to the fifth embodiment of the present invention, which is sandwiched by upper and lower radiating fins.

As a result, the power semiconductor device 2 of the present embodiment includes no insulating member 38, 39 on the upper and lower main surfaces 16, 18 of the metal block 4. However, when the power semiconductor device 2 is installed between the upper and lower heat sinks (radiating fins) 44, 45 as shown in FIG. 8, upper and lower insulating films 52, 53 are provided between the upper/lower heat sinks 44, 45 and the metal block 4. The upper and lower insulating films 52, 53 cover across and extend beyond the circumference of the upper and lower main surface 16, 18, respectively. Those insulating films 52, 53 may be made of material including, for example, ceramic and silicone resin mixed with ceramic particles of high thermal conductivity.

The power semiconductor device 2 of the fifth embodiment corresponds to a typical or standard type of the power semiconductor device, which has no insulating member. When the power semiconductor device 2 is assembled with the upper/lower heat sinks (radiating fins) 44, 45, with the upper and lower insulating films 52, 53 intervened therebetween, it has similar advantages as the power semiconductor device of the first embodiment.

To this end, since the upper/lower heat sinks 44, 45 are installed on the upper/lower main surfaces via insulating films 52, 53, the heat generated in the power semiconductor chip 6 is transmitted to the metal block 4, which in turn is dissipated through the upper and lower insulating films 52, 53 and the upper and lower heat sinks 44, 45 to the atmosphere. The upper and lower insulating films 52, 53 having high thermal conductivity helps transmission of the heat as quickly and smoothly as the other components such as metal block 4, and the first and second lead frames 8, 10 thereby substantially improving the heat dissipation feature of the power semiconductor device 2.

As described above, according to the power semiconductor device 2 of the fifth embodiment, the heat generated in the power semiconductor chip 6 can efficiently be dissipated from the upper and lower radiating fins 44, 45 so that the reliability of the power semiconductor device 2 is substantially improved. In other words, the power semiconductor chip 6 that controls intense amount of current can be incorporated in the power semiconductor device 2. Further, because of the high heat dissipation feature, the metal block 4 and the power semiconductor device 2 can substantially be downsized.

Also, although FIG. 7 illustrates only one power semiconductor chip 6 on the metal block 4, the power semiconductor device 2 of the present invention may include a plurality of power semiconductor chips 6 on the metal block 4. In this instance, the metal block 4 may have one or more channels or recesses on either one of the upper and lower main surfaces 16, 18. Alternatively, the channels (recesses) for receiving the power semiconductor chips may be formed both on the upper and lower main surfaces 16, 18 of the metal block 4.

Figure 9:
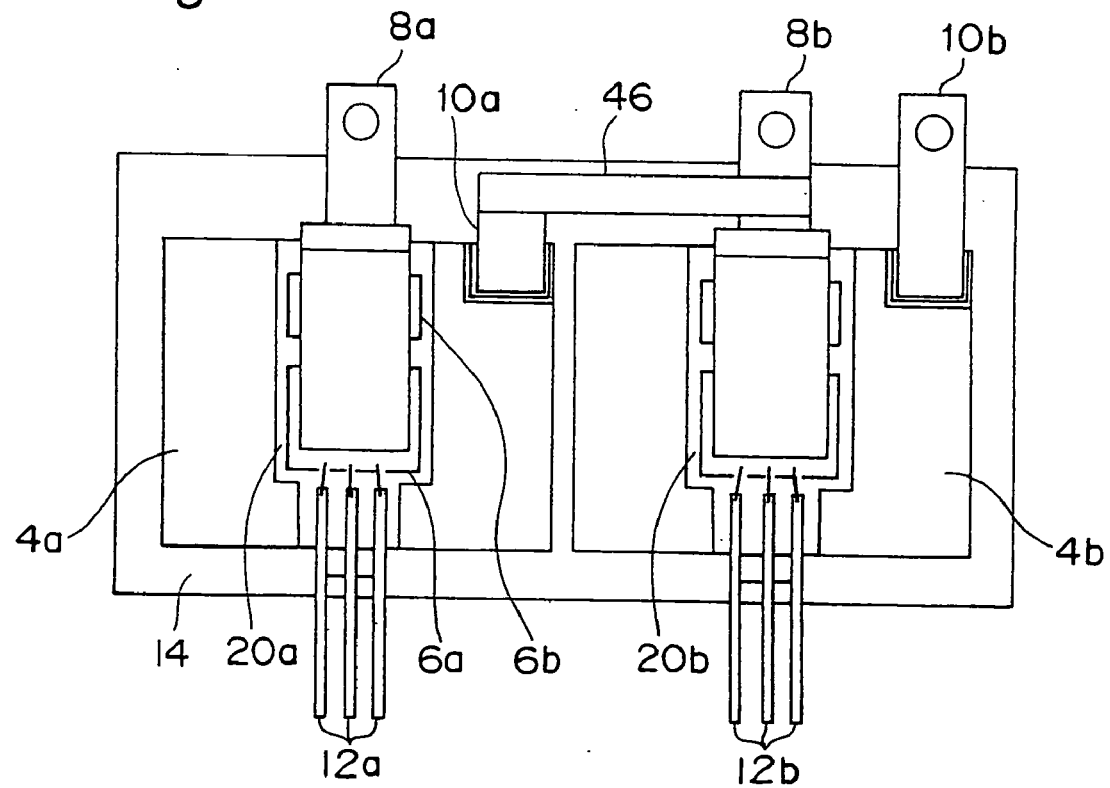
FIG. 9 is a top plan view of a modified power semiconductor device of the fifth embodiment.

In addition, as illustrated in FIG. 9, a plurality of metal blocks 4a, 4b may be integrally molded with resin and be encompassed by the molded resin 14. In this instance, the second lead frame 10a secured on one of the metal block 4a may be connected to the first lead frame 8b over another metal block 4b via a connecting lead frame 46 within the molded resin.

Embodiment 6

Figure 10A:
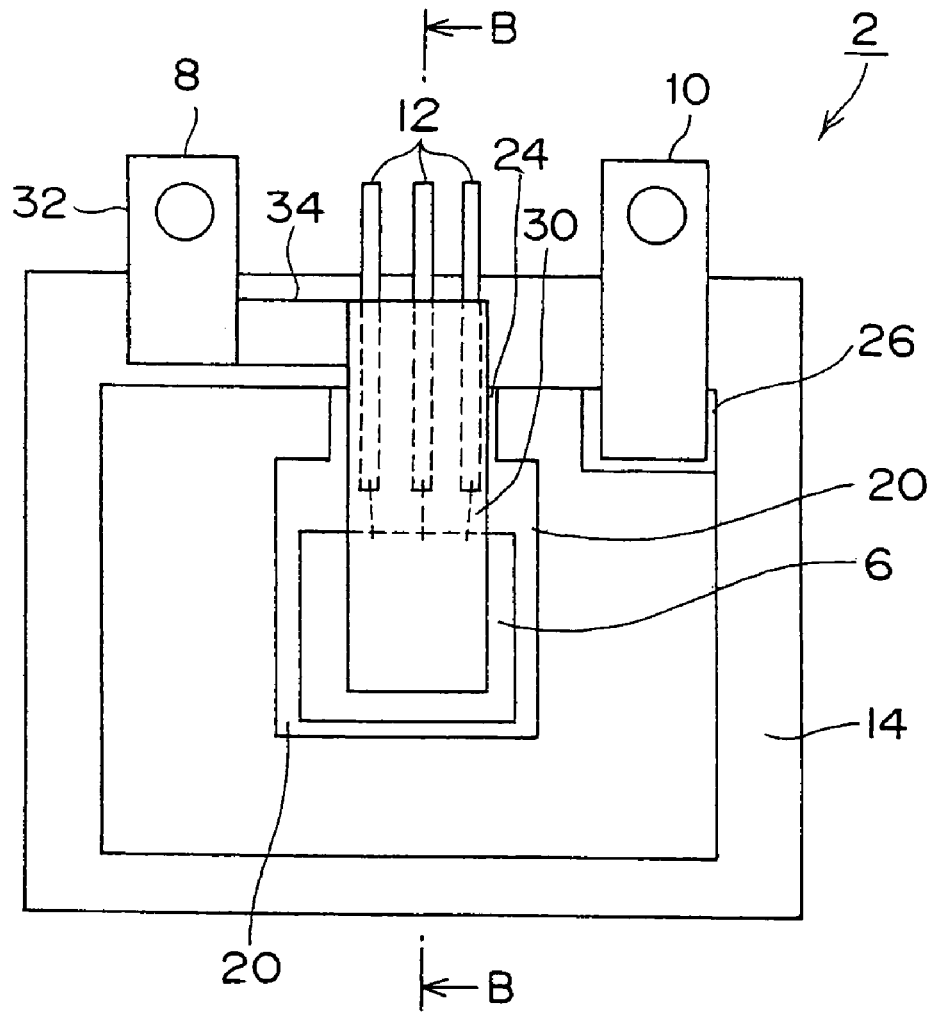
FIG. 10A is a top plan view of the power semiconductor device of the sixth embodiment.
Figure 10B:
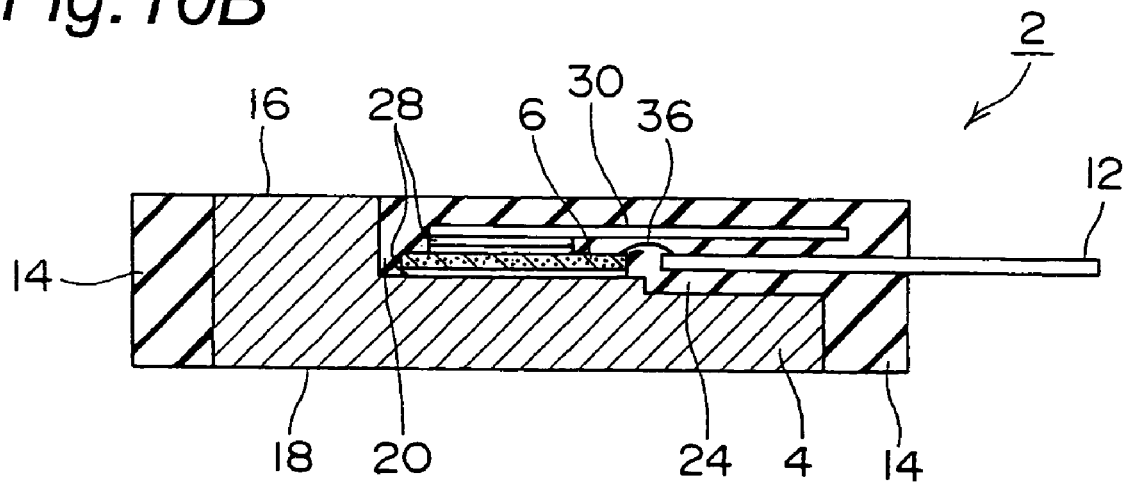
FIG. 10B is a cross sectional view taken along line B-B in FIG. 10A.

Referring to FIGS. 10A-10B, another power semiconductor device according to the sixth embodiment of the present invention will be described herein. The power semiconductor device 2 of the sixth embodiment is similar to that of the fifth embodiment except that the metal block includes the first and third recesses only and defines no channel extending across the upper main surface. The components shown in FIGS. 10A-10B similar to those in FIGS. 7A-7C have the reference numerals similar thereto, and the duplicate description for the similar structure of the sixth embodiment will be eliminated.

As described above, while in the fifth embodiment, the first recess 20 along with the second and third recess 22, 24 defines the channel 19 extending across the upper main surface 16, according to the sixth embodiment, the second recess 22 is eliminated and the third recess 24 receives the first lead frame 8 and the third lead frames 12 as well. Also, as shown in FIG. 10B, the third recess 24 is designed to be deeper than the first recess 20.

The first lead frame 8 includes the first flat portion 30, and the second flat portion 32, extending in parallel to each other. It also includes the connecting portion (bending portion) 34 between the first and second flat portions 30, 32, extending perpendicular to those flat portions. Thus, the first lead frame 8 is bent at the interfaces between the first flat portions 30 and the connecting portion 34 and between the connecting portion 34 and the second flat portions 32 so that the second flat portions 32 has a level lower than the first flat portions 30.

Within the third recess 24, the control lead frame 12 and the conductive wire 36 are located beneath the first flat portion 30 of the first lead frame 8, as illustrated in FIG. 10B. According to the present embodiment, the first lead frame 8 is connected with the chip electrode 7 of the power semiconductor chip 6 via the solder layer 28, as the fifth embodiment. However, the second flat portion 32 of the first lead frame 8 of this embodiment extends outwardly from a position different (offset) from one of the fifth embodiment (see FIG. 10A).

The control lead frames 12 are provided within the third recess 24 so that one ends thereof are electrically connected with the control electrode (not shown) such as a gate electrode of the IGBT chip, via the conductive wires 36.

Upon arrangement of the first lead frame 8 and the control lead frames 12 within the third recess 24 and elimination of the second recess, the contacting area of the upper main surface 16 of the metal block 4 with the upper insulating film 52 (and the upper heat sink 44 to be installed) can substantially be extended by the area corresponding to one of the second recess. Therefore, the heat generated in the power semiconductor chip 6 can more efficiently be dissipated from the upper main surface 16 of the metal block 4 than the fifth embodiment.

Further, in the power semiconductor device 2 of the sixth embodiment, the first flat portion 30 of the first lead frame 8 may preferably have a through-hole (not shown) close to the wire-bonding portions on the chip electrode 7 and the third lead frames 12 for facilitating the wire-bonding therebetween. This makes it easy to use a device for supporting the lead frames and wire-bonding tools.

What is claimed is:

1. A semiconductor device, comprising:
   a monolithic metal block having first and second main surfaces that are substantially parallel to each other, a recess defined in the first main surface, and peripheral side surfaces that are substantially perpendicular to the first and second main surfaces and are encompassed by a package member of insulating material;
   a semiconductor chip received within the recess of said metal block and mounted on said metal block;
   a first terminal electrically connected with said semiconductor chip; and
   a second terminal electrically connected with said metal block.

2. The semiconductor device according to claim 1, further comprising:
   a first insulating member contacting the first main surface of said metal block and extending along the first main surface and over the recess of said metal block; and
   a second insulating member contacting the second main surface of said metal block.

3. The semiconductor device according to claim 2, wherein said package member of the insulating material fills at least the recess and exposes said first and second insulating members.

4. The semiconductor device according to claim 3,
   wherein said first terminal is sandwiched between said semiconductor chip and said first insulating member.

5. The semiconductor device according to claim 4,
   wherein said first terminal has a curled portion formed between said semiconductor chip and said first insulating member for biasing said semiconductor chip.

6. The semiconductor-device according to claim 1,
   wherein the recess includes a channel extending across the first main surface of said metal block.

7. The semiconductor device according to claim 1, further including a third terminal electrically connected with said semiconductor chip; and
   wherein said third terminal is provided between said first terminal and said metal block.

8. The semiconductor device according to claim 3, further including a pair of radiators, said radiators being secured on the first and second insulating members, respectively.

9. The semiconductor device according to claim 1, wherein said package member of the insulating material fills at least the recess and exposes the first and second main surfaces of said metal block.

10. The semiconductor device according to claim 9,
    wherein said packaging member covers said first terminal at least in a region over the recess of said metal block.

11. The semiconductor device according to claim 9, further including a pair of radiators, said radiators being secured on the first and second main surfaces of said metal block via a pair of insulating films, respectively.

12. The semiconductor device according to claim 9,
    wherein said metal block defines another recess on the second main surface.

13. The semiconductor device according to claim 1, wherein said monolithic metal block is constituted by substantially the same metallic material entirely between the first and second main surfaces.

14. The semiconductor device according to claim 1, wherein an upper surface of said first terminal is substantially flush with the first main surface of said metal block.

15. The semiconductor device according to claim 1, wherein:
    the second terminal comprises a lower surface connected directly to said metal block, and an upper surface opposite to the lower surface of the second terminal; and
    the package member of the insulating material encompasses the upper surface of the second terminal.

16. A semiconductor device, comprising:
    a monolithic metal block having first and second main surfaces and defining a recess on the first main surface;
    a semiconductor chip received within the recess of said metal block and mounted on said metal block;
    a first terminal electrically connected with said semiconductor chip;
    a second terminal electrically connected with said metal block;
    a first insulating member contacting the second main surface of said metal block; and a metal layer contacting the first insulating member so as to sandwich the first insulating member between the second main surface of said metal block and said metal layer.

17. The semiconductor device according to claim 16, wherein:
the first and second main surfaces of said metal block are substantially parallel to each other; and
said metal block comprises peripheral side surfaces being substantially perpendicular to the first and second main surfaces of the metal block, the peripheral side surfaces of the metal block being encompassed by a package member of insulating material.

18. The semiconductor device according to claim 16, further comprising:
a second insulating member contacting the first main surface of said metal block and extending along the first main surface and over the recess of said metal block.

19. The semiconductor device according to claim 18, wherein said first terminal has a curled portion formed between said semiconductor chip and said second insulating member for biasing said semiconductor chip.

20. The semiconductor device according to claim 18, further including a pair of radiators, said radiators being secured on the first and second insulating members, respectively.

21. The semiconductor device according to claim 18, wherein:
said package member of the insulating material fills at least the recess and exposes the first and second main surfaces of said metal block; and
the semiconductor device further includes a pair of radiators, said radiators being secured on the first and second main surfaces of said metal block via a pair of insulating films, respectively.

* * * * *